United States Patent
Han

(10) Patent No.: US 7,037,748 B2
(45) Date of Patent: May 2, 2006

(54) CMOS IMAGE SENSOR AND METHOD FOR MANUFACTURING THE SAME

(75) Inventor: Chang Hun Han, Icheon-Si (KR)

(73) Assignee: Dongbuanam Semiconducor Inc., Seoul (KR)

( * ) Notice: Subject to any disclaimer, the term of this patent is extended or adjusted under 35 U.S.C. 154(b) by 0 days.

(21) Appl. No.: 10/747,196

(22) Filed: Dec. 30, 2003

(65) Prior Publication Data

US 2005/0062084 A1 Mar. 24, 2005

(30) Foreign Application Priority Data

Sep. 23, 2003 (KR) ............... 10-2003-0065730

(51) Int. Cl.
*H01L 21/00* (2006.01)
(52) U.S. Cl. ............ 438/73; 438/78; 438/424; 438/377
(58) Field of Classification Search .......... 438/73, 438/78, 424, 377; 257/291, 292, 461
See application file for complete search history.

(56) References Cited

U.S. PATENT DOCUMENTS 6,462,365 B1   10/2002   He et al.
6,486,521 B1   11/2002   Zhao et al.
6,521,924 B1 *  2/2003   Han et al. ............ 257/290
6,849,886 B1 *  2/2005   Han .................... 257/292

FOREIGN PATENT DOCUMENTS

KR   2003-42303   5/2003
KR   2003-42308   5/2003

* cited by examiner

*Primary Examiner*—Sara Crane
(74) *Attorney, Agent, or Firm*—Finnegan, Henderson, Farabow, Garrett & Dunner, L.L.P.

(57) ABSTRACT

A CMOS image sensor and a manufacturing method thereof, wherein the gates of several transistors of the CMOS image sensor are formed in an active region defined by an isolation region for a unit pixel of the CMOS image sensor, and a passivation layer composed of insulating layer is formed on the semiconductor substrate. Impurities are ion-implanted into the active region to form one or more diffusion regions of a photo diode of the CMOS image sensor, wherein the passivation layer prevents a boundary portion of the active region from being ion-implanted. Thus, damages by ion implantation at the boundary portion between the diffusion region for the photo diode and the isolation region are prevented, and the dark current of the CMOS image sensor is reduced.

9 Claims, 11 Drawing Sheets

CMOS IMAGE SENSOR AND METHOD FOR MANUFACTURING THE SAME

This application is based on and claims priority to Korean Patent Application No. 10-2003-0065730, filed Sep. 23, 2003, the entire contents of which are incorporated herein by reference.

BACKGROUND OF THE INVENTION

1. Field of the Invention

The present invention relates to a CMOS image sensor, and more particularly to a CMOS image sensor and method for manufacturing the same, in which a diffusion region of a photo diode is disposed apart from an isolation region, and thereby a dark current is reduced.

2. Description of the Prior Art

In general, an image sensor is a semiconductor device for converting an optical image into electrical signals, and is generally classified into a charge coupled device (CCD) and a complementary MOS (CMOS) image sensor.

A CCD generally includes a plurality of MOS capacitors and each MOS capacitor is adjacently disposed to each other. Charge carriers are stored on one of the MOS capacitors and then transferred to another MOS capacitor next to the MOS capacitor with the charge carriers stored therein. A CCD has various disadvantages, such as complicated drive mode, high power consumption, complicated manufacturing process, i.e., a large number of processing steps, and so forth. Additionally, a CCD has a disadvantage in that it is difficult to make a compact-size product, due to the difficulty in integrating various circuits such as a controlling circuit, a signal processing circuit, analog/digital converting circuit and so on into a single chip.

Currently, as a next generation image sensor for overcoming the disadvantages of a CCD, attention is attracted to CMOS image sensors. A CMOS image sensor is a device employing a switching mode of forming a photo diode and a MOS transistor in each unit pixel on a semiconductor substrate using CMOS technologies. A CMOS image sensor generally includes a controlling circuit, a signal processing circuit, and so on as a periphery circuit, and sequentially detects outputs of each unit pixel by means of the MOS transistors. Thus, with the photo diode and MOS transistor formed within each unit pixel, a CMOS image sensor sequentially detects electrical signals of each unit pixel in a switching mode to realize an image.

A CMOS image sensor has advantages such as low power consumption, simple manufacturing process, i.e., small number of processing steps, and so on. In addition, a CMOS image sensor has an advantage in that the product is made compact by integration of a controlling circuit, a signal processing circuit, an analog/digital converting circuit, etc. into a single chip. Therefore, CMOS image sensors are presently broadly used in various applications, such as digital still cameras, digital video cameras, and so forth.

FIG. 1 shows a circuit diagram for a unit pixel of a conventional CMOS image sensor. As shown in FIG. 1, a unit pixel 100 of the CMOS image sensor includes a photo diode 110 as a photoelectric transformation section, and four transistors, including a transfer transistor 120, a reset transistor 130, a drive transistor 140, and a select transistor 150. An output terminal OUT of the unit pixel 100 is connected with a load transistor 160. Herein, a reference label FD indicates a floating diffusion region, a reference label Tx indicates gate voltage of the transfer transistor 120, a reference label Rx indicates gate voltage of the reset transistor 130, a reference label Dx indicates gate voltage of the drive transistor 140, and a reference label Sx indicates gate voltage of the select transistor 150.

FIG. 2 shows a layout of a unit pixel of the conventional CMOS image sensor. As shown in FIG. 2, in the unit pixel 100, an active region is a region defined by a bold solid line and an isolation region is a region outside the active region in which an isolation layer (not shown) is formed. The gates 123, 133, 143 and 153, respectively of the transfer transistor 120, reset transistor 130, drive transistor 140 and select transistor 150, are disposed as shown in FIG. 2. The reference label FD indicates a floating diffusion region, and the reference label PD indicates a portion of the photo diode 110.

FIG. 3 is a structural cross-sectional view showing the photo diode portion of the unit pixel taken along a line A—A of FIG. 2. As shown in FIG. 3, a $P^-$ type epitaxial layer 11 is formed on a $P^{++}$ type semiconductor substrate 10, wherein $P^{++}$ indicates a heavily doped region. To define an active region of the semiconductor substrate 10, an isolation region 13 is formed in a portion of the epitaxial layer 11. An $n^-$ type diffusion region 111 and a $P_0$ type diffusion region 113 of the photo diode 110 are formed in a portion of the epitaxial layer 11, the $P_0$ type diffusion region 113 being positioned on the $n^-$ type diffusion region 111, wherein $n^-$ indicates a low doping of impurities, and $P_0$ indicates a medium doping of impurities.

The conventional CMOS image sensor 100 with such a structure has disadvantages such as degradations of the performance and electric charge storing capacity, due to an increase of dark current, which is generated by electrons being transferred to the floating diffusion region from the photo diode 110 when no light is received by the photo diode 110.

It has been reported that dark current has been caused generally from various kinds of defects, dangling bonds, and so forth, in a portion adjacent to the surface of the semiconductor substrate 10, a boundary portion of the isolation region 13 and the $P_0$ type diffusion region 113, a boundary portion of the isolation region 13 and the $n^-$ type diffusion region 111, a boundary portion of the $P_0$ type diffusion region 113 and the $n^-$ type diffusion region 111, the $P_0$ type diffusion region 113 and the $n^-$ type diffusion region 111.

By using both the $P_0$ type diffusion region 113 and the $n^-$ type diffusion region 111 for the photo diode, the conventional CMOS image sensor 100 has reduced dark current generated in the portion adjacent to the surface of a silicon substrate.

However, the conventional CMOS image sensor 100 has been greatly affected by dark current generated at the boundary portions of the isolation region 13 and the $P_0$ type diffusion region 113, and in the $P_0$ type diffusion region 113 and the $n^-$ type diffusion region 111.

Particularly, as shown in FIG. 3, when a photoresist pattern (not shown) used as a mask layer during ion implantation for forming the $n^-$ type diffusion region 111 and the $P_0$ type diffusion region 113 is formed on the semiconductor substrate 10, the whole active region for the photo diode 110 is exposed. When impurities for the $n^-$ type diffusion region 111 and the $P_0$ type diffusion region 113 are ion-implanted in the active region of the photo diode 100, those impurities are also ion-implanted into the boundary portion between the active region and the isolation region 13 of the photo diode 110.

Thus, damages are caused by the ion implantation of impurities at the boundary portion between the $n^-/P_0$ type diffusion regions 111 and 113 and the isolation region 13, further generating defects. The defects may cause a generation of electron or hole carriers, and provide recombination centers for the electrons and the holes, thereby increasing the leakage current of the photo diode and the dark current of the CMOS image sensor.

As described above, a conventional CMOS image sensor has such a structure that, when forming the diffusion region of the photo diode, impurities are also ion-implanted in the boundary portion between the isolation region and the active region for the photo diode, thereby increasing the dark current of the photo diode. Also, with such a structure, it is difficult to maintain uniform device characteristics among the pixels of the image sensor. Therefore, the performance of the conventional image sensor is generally not satisfactory.

Pending Korean Patent Publication Nos. 2003-42303 and 2003-42308 disclose a method for reducing dark current of CMOS image sensor by implanting impurities into an active region for forming a photo diode. However, they do not provide a solution to restrict an increase of dark current by preventing impurities from being ion-implanted into the boundary portion between an isolation region and an active region for a photo diode.

Also, U.S. Pat. Nos. 6,486,521 and 6,462,365, to Omnivision Technologies Inc., both entitled "Active Pixel Having Reduced Dark Current in a CMOS Image Sensor," disclose a method for restricting an increase of dark current due to dangling bonds at the surface of a photo diode, by forming a transparent insulating layer such as an oxide layer on the surface of the photo diode as a passivation layer. However, neither do these patents provide a solution to restrict an increase of dark current by preventing impurities from being ion-implanted into the boundary portion between the isolation region and the active region for the photo diode.

SUMMARY OF THE INVENTION

Accordingly, the present invention provides a method to improve device characteristics of CMOS image sensors by preventing impurities from being ion-implanted to the boundary portion between an isolation region and an active region for a photo diode, thus reducing dark current.

The present invention also provides a method to improve device characteristics of CMOS image sensors by maintaining uniform device characteristics among the pixels of the CMOS image sensor.

In accordance with the present invention, there is provided a CMOS image sensors that comprises a semiconductor substrate having an isolating region and an active region; and an impurity diffusion region of a photo diode in said semiconductor substrate, wherein said impurity diffusion region is formed spaced apart from said isolation region.

In one aspect, the CMOS image sensor further comprises a passivation layer formed over a boundary between the isolation region and the active region.

In another aspect, the passivation layer is composed of an insulating layer.

In still another aspect, the passivation layer is composed of any one of single layer of an oxide layer and a nitride layer, or of multi layers of at least one oxide layer and at least one nitride layer.

In yet another aspect, the semiconductor substrate is a $P^{++}$ type silicon substrate having a $P^-$ type epitaxial layer formed thereon, and the diffusion region for the photo diode has an $n^-$ type diffusion region.

In one aspect, a $P^o$ type diffusion region is formed on the $n^-$ type diffusion region of the photo diode so as to reduce dark current generated on the surface of the semiconductor substrate.

In accordance with the present invention, there is also provided a method for manufacturing a CMOS image sensor, the method comprising forming an isolating region in a semiconductor substrate to define an active region for a unit pixel of the CMOS image sensor; forming a passivation layer over a boundary between the isolation region and the active region; forming a mask layer over the isolation region and the portion of the passivation layer; and performing an ion implantation of impurities for forming a diffusion region of the photo diode in a portion of the active region, so said diffusion region is formed spaced apart from said isolation region.

In one aspect, the step of forming the passivation layer is performed after, gates of the transistors are formed on a portion of the active region.

In another aspect, the passivation layer is composed of an insulating layer.

In still another aspect, the passivation layer is composed of any one of single layer of an oxide layer and a nitride layer, or of multi layers of at least one oxide layer and at least one nitride layer.

In one aspect, the semiconductor substrate is a $P^{++}$ type silicon substrate having a $P^-$ type epitaxial layer formed thereon, and the diffusion region for the photo diode has an $n^-$ type diffusion region.

In another aspect, a $P^o$ type diffusion region is formed on the $n^-$ type diffusion region of the photo diode so as to reduce dark current generated on the surface of the semiconductor substrate.

In accordance with the present invention, the passivation layer composed of insulating layer is formed as a masking layer to prevent a boundary portion of the active region for the photo diode from being ion implanted, so that the diffusion region of the photo diode is spaced apart from the isolation region, thereby preventing the boundary portion of the active region from damages by an ion implantation of impurities, and reducing the dark current of the CMOS image sensor.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE EMBODIMENTS

Figure 1:
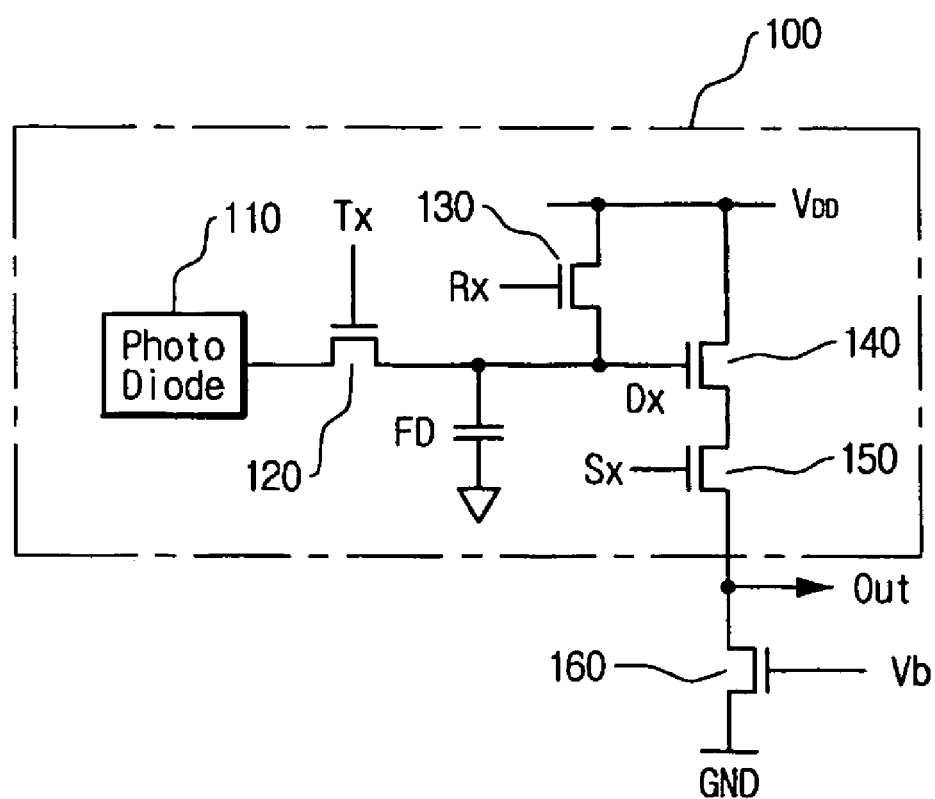
FIG. 1 shows a circuit of a unit pixel of a conventional CMOS image sensor.
Figure 2:
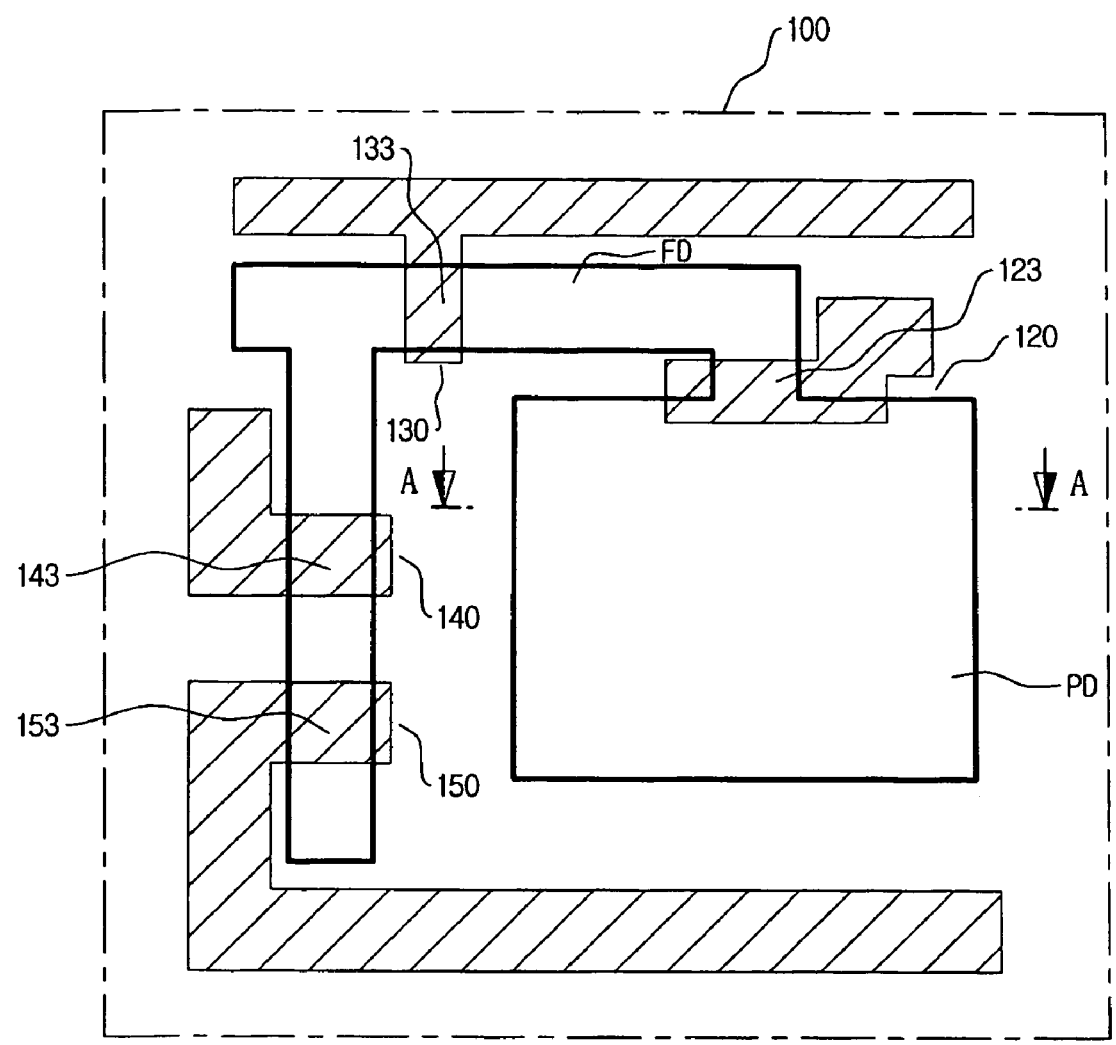
FIG. 2 shows a layout of a unit pixel of the conventional CMOS image sensor.
Figure 3:
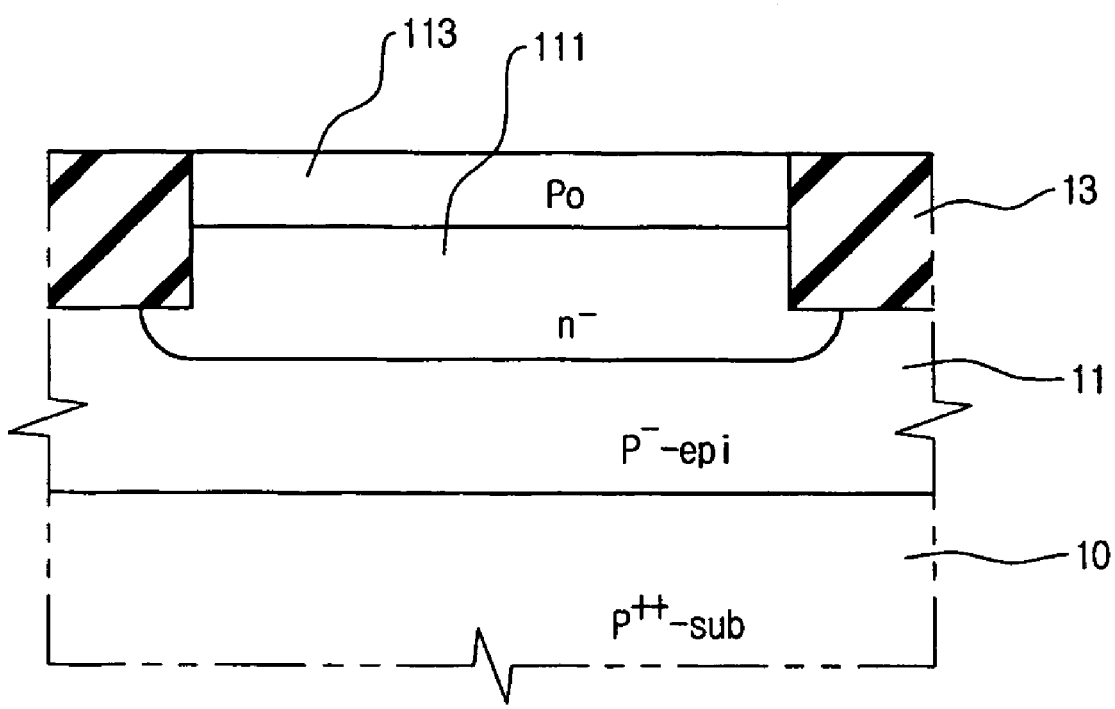
FIG. 3 is a cross-sectional view showing a portion of a photo diode of a unit pixel taken along line A—A of FIG. 2.

Hereinafter, an embodiment of the present invention will be described with reference to the accompanying drawings. In the following description and drawings, the same reference numerals are used to indicate the same or similar components. A P$^{++}$ type means a high concentration P type, a P$^o$ type means a medium concentration P type, and an n$^-$ type means a low concentration n type.

Figure 4:
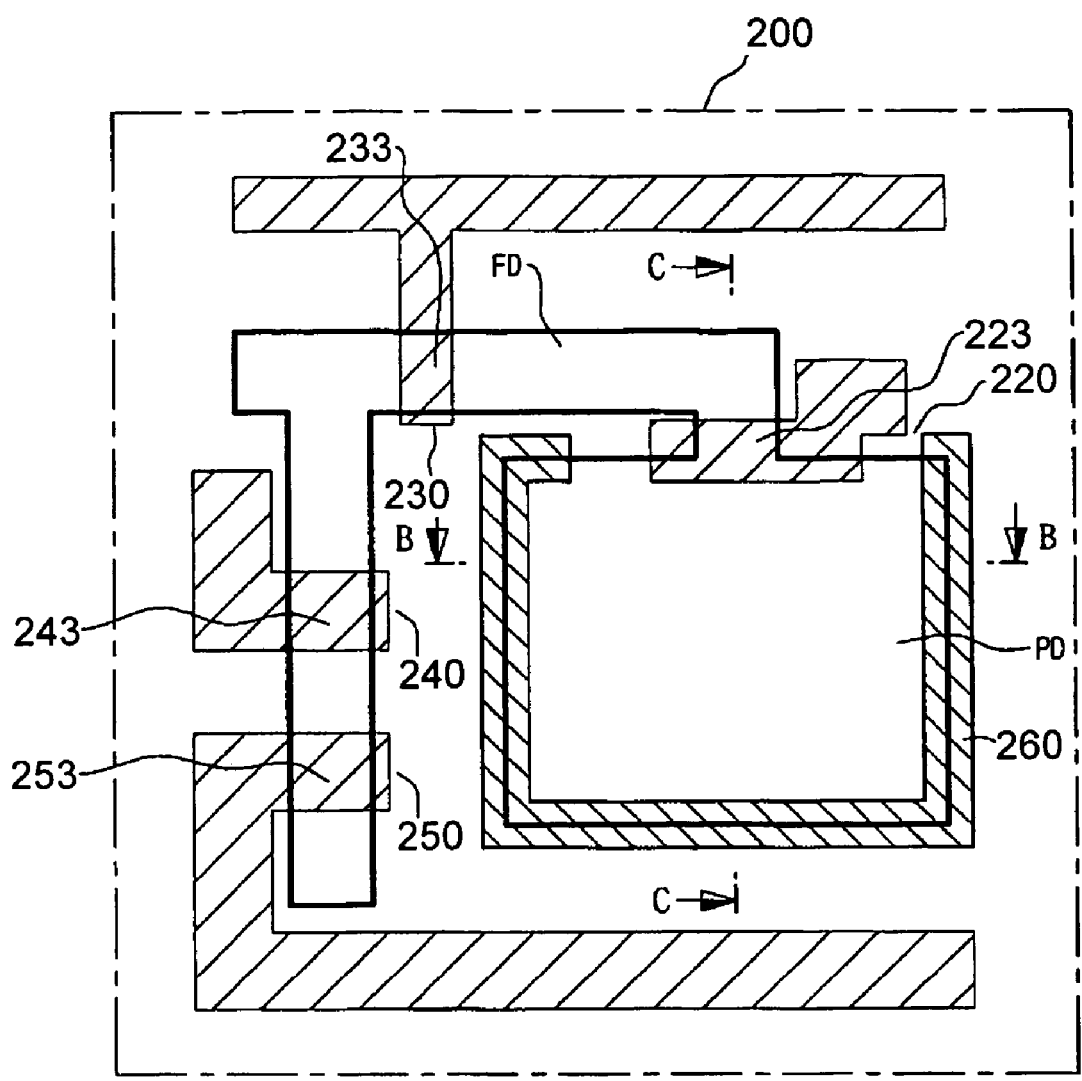
FIG. 4 is a layout of a unit pixel of a CMOS image sensor according to an embodiment of the present invention.

FIG. 4 is a layout of a unit pixel 200 of a CMOS image sensor according to an embodiment of the present invention.

Referring to FIG. 4, in unit pixel 200, a solid line indicates an active region wherein a photo diode PD is to be formed, and is defined by an isolation region (not shown) formed surrounding the active region. The gates 223, 233, 243 and 253, respectively of a transfer transistor 220, a reset transistor 230, a drive transistor 240 and a select transistor 250 are disposed as shown in FIG. 4.

Furthermore, in order to prevent the boundary portion of the active region from being damaged by ion implantation of impurities, a passivation layer 260 is disposed on and extends along the boundary portion between the active region and the isolation region. A reference numeral FD indicates a floating diffusion region.

It is to be understood that, although the unit pixel 200 as shown in FIG. 4 has one photo diode and four transistors, it may have one photo diode and three transistors, for example, a reset transistor, a driver transistor, and a select transistor. For convenience of explanation, the present invention will be described with reference to a unit pixel having one photo diode and four transistors.

Figure 5:
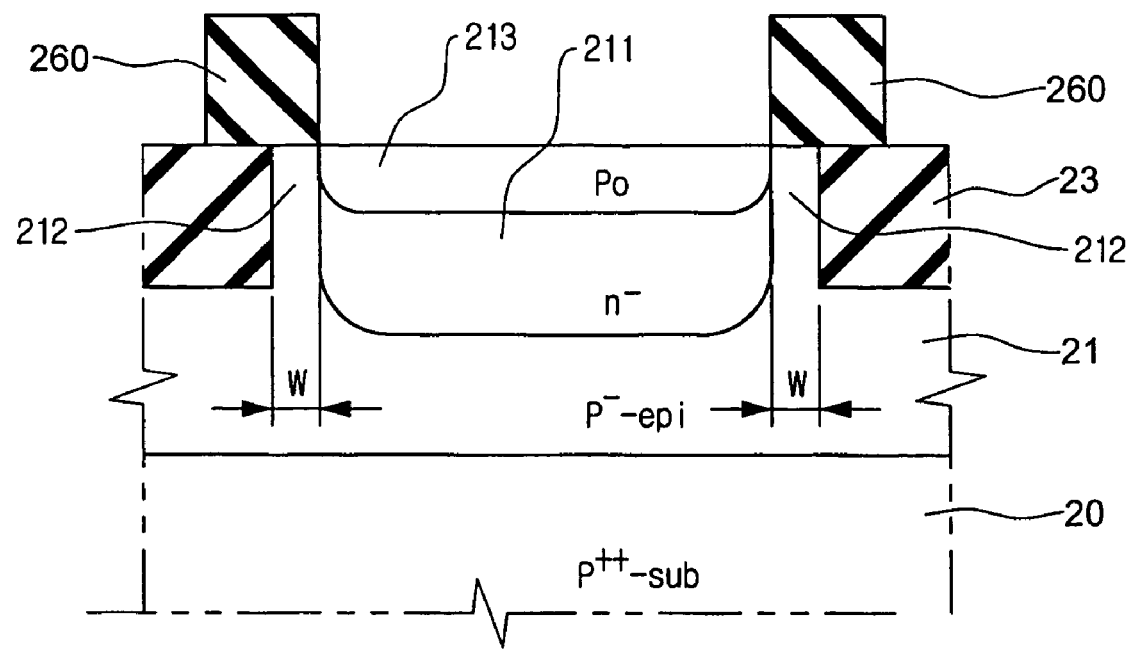
FIG. 5 is a cross-sectional view showing a portion of a photo diode of a unit pixel taken along line B—B of FIG. 4.
Figure 6:
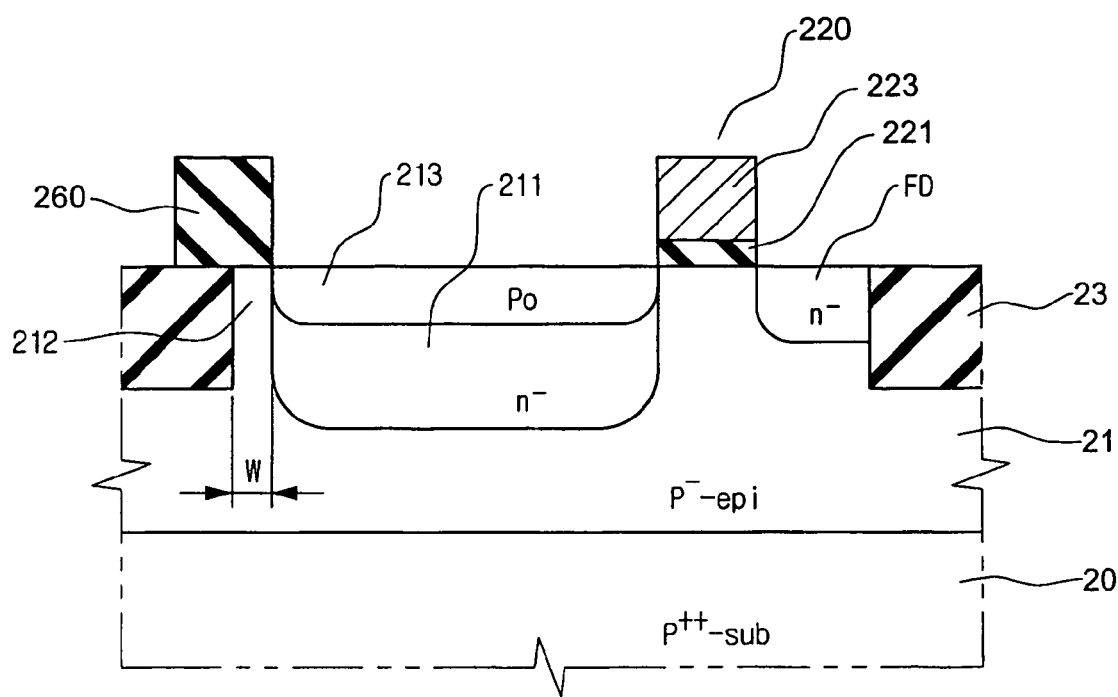
FIG. 6 is a cross-sectional view showing a portion of a photo diode of a unit pixel and a transfer gate taken along line C—C of FIG. 4.

FIG. 5 is a cross-sectional view of a portion of the photo diode PD of the unit pixel 200 taken along line B—B of FIG. 4, and FIG. 6 is a cross-sectional view of a portion of the photo diode PD of the unit pixel 200 and the transfer gate 220 taken along line C—C of FIG. 4.

Referring to FIGS. 5 and 6, a P$^-$ type epitaxial layer 21 is formed on a P$^{++}$ type semiconductor substrate 20. The semiconductor substrate 20 may comprise, for example, a single crystal silicon substrate. To define an active region of the semiconductor substrate 20, an isolation region 23 is formed on a portion of the epitaxial layer 21. The isolation region 23 may be formed by, for example, a shallow trench isolation (STI) process or a local oxidation of silicon (LOCOS) process. A gate insulating layer 221 and a gate 223 of transfer transistor 220 are formed on a portion of the epitaxial layer 21 for the transfer transistor 220.

An n$^{31}$ type diffusion region 211 and a P$^0$ type diffusion region 213 for photo diode PD are formed in the epitaxial layer 21, and are spaced apart from the isolation region 23 with a boundary portion 212 of the active region disposed therebetween. A width of the boundary portion 212 may be, for example, above 50 μm. The isolation region 23 may restrict an increase of leakage current generated on the boundary portion between the n$^-$/P$^0$ type diffusion regions 211 and 213 and the isolation region 23, and therefore also restrict the increase of the dark current.

A passivation layer 260 is formed on both the boundary portion 212 and the isolation region 23. The passivation layer 260 may be composed of an insulating layer consisting of, for example, any one of single layer of an oxide layer and a nitride layer, or of multi layers of at least one oxide layer and at least one nitride layer.

Also, the floating diffusion region FD is formed in the epitaxial layer 21 and is spaced apart from the n$^-$/P$^o$ type diffusion regions 211 and 213 with the gate 223 of the transfer transistor 220 disposed therebetween.

It is to be understood that, although the photo diode PD as shown in FIGS. 5 and 6 has the n$^-$/P$^o$ type diffusion regions 211 and 213, it may have the n$^-$ type diffusion region 211 only. Aspects of the present invention will be now described with reference to a photo diode having P$^o$/n$^-$ type diffusion region.

In the CMOS image sensor as described above, since the passivation layer 260 protects the isolation region 23 together with the boundary portion 212 of the active region for the photo diode PD, impurities for forming the n$^-$/P$^o$ type diffusion regions 211 and 213 of the photo diode PD are not ion-implanted to boundary portion 212, i.e., the impurities are not ion-implanted into the boundary portions between the isolation region 23 and the n$^-$ type diffusion region 211 and between the isolation region 23 and the P$^o$ type diffusion region 213.

The image sensor according to the present invention reduces a leakage current generated in the boundary portions between the isolation region 23 and the n$^-$ type diffusion region 211 and between the isolation region 23 and the P$^o$ type diffusion region 213, and therefore also reduces dark current. Thus, the image sensor according to the present invention may have uniform device characteristics among the unit pixels, and have improved dark current characteristics, electric charge storage capacity, and other device characteristics.

A method for manufacturing CMOS image sensor according to an embodiment of the present invention will be now described with reference to FIGS. 7A to 7E. For illustration purposes, the method is described based on a cross-sectional structure of the unit pixel as shown in FIG. 6.

Figure 7A:
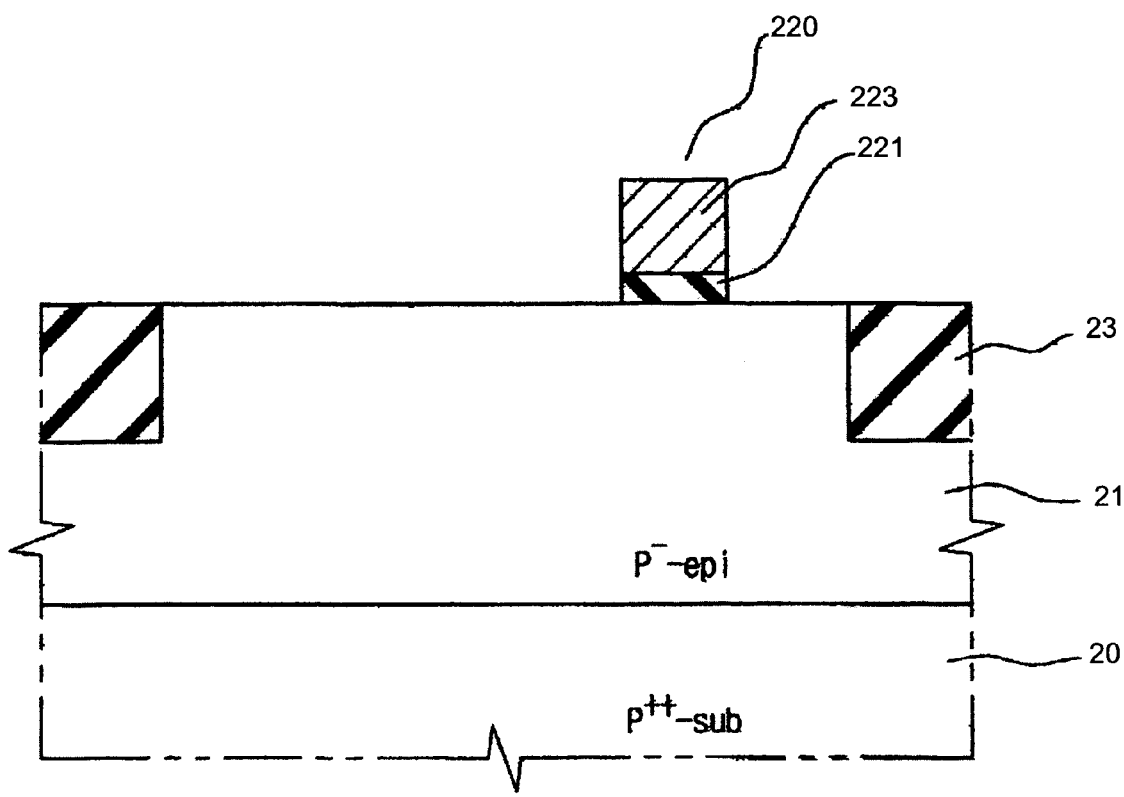
FIGS. 7A to 7E are process views showing a method for manufacturing a CMOS image sensor according to an embodiment of the present invention.

Referring to FIG. 7A, a semiconductor substrate 20 is provided. The semiconductor substrate 20 may comprise a heavily doped material, for example, a P$^{++}$ type single crystal silicon substrate. On a surface of the semiconductor substrate 20 on which a device is to be formed, a lightly doped, for example, P$^-$ type, epitaxial layer 21 is grown by an epitaxial process. With the epitaxial layer 21, a photo diode subsequently formed therein may have a deep and large depletion region, and therefore may have an improved capability of collecting photocharge, or an improved photosensitivity.

To define an active region for the transfer transistor 220, the reset transistor 230, the drive transistor 240, and the select transistor 250, and an active region of the photo diode PD, an isolation region 23 is formed in a portion of the epitaxial layer 21. In one aspect, the isolation region 23 may be formed by STI process or LOCOS process.

Then, a gate insulating layer for the transfer transistor 220, the reset transistor 230, the drive transistor 240, and the select transistor 250 of FIG. 4 is formed to a desired thickness on the epitaxial layer 21 in the entire active region including the active region of the photo diode PD. In one aspect, the gate insulating layer may comprise a thermal oxide layer grown by a thermal oxidation process.

A conductive gate layer, for example, a high concentration poly crystal silicon layer, is then formed to a desired thickness on the gate insulating layer. In one aspect, the conductive gate layer may comprise a high concentration poly crystal silicon layer and a silicide layer formed thereon.

Following the formation of the gate layer, the conductive gate layer and the gate insulating layer are etched using a photo mask (not shown) to form the gates 223, 233, 243, and 253. Although FIG. 7A only shows the transfer transistor 220 having a structure including the gate insulating layer 221 and the gate layer 223, the reset transistor 230, the drive transistor 240, and the select transistor 250 also have the same structure as that of the transfer transistor 220.

An passivation insulating layer is then deposited to a certain thickness on the semiconductor substrate 20 including the active region for the photo diode PD by a chemical vapor deposition (CVD), for example, a low pressure CVD. In one aspect, the passivation insulating layer may be composed of an insulating layer consisting of, for example, any one of single layer of an oxide layer and a nitride layer, or of multi layers of at least one oxide layer and at least one nitride layer.

Figure 7B:
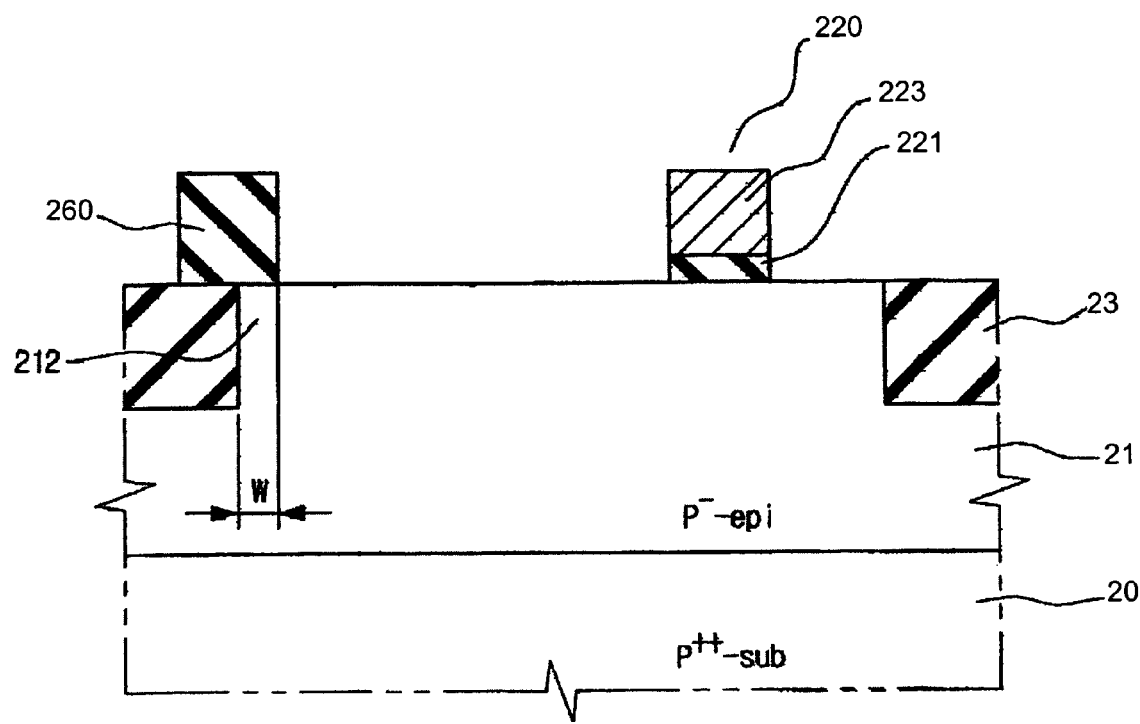

Then, as shown in FIG. 7B, the passivation insulating layer is etched by wet or dry etching to form the passivation layer 260. In one aspect, the passivation layer 260 may extend some distance W, for example, above 50 □ from the isolation region 23 toward a center portion of the active region of the photo diode PD. In other words, the passivation layer 260 covers the isolation region 23 and a boundary portion 212 of the active region next to the isolation region 23. In another aspect, the passivation layer 260 extends through the boundary region between the active region and the isolation region 23.

Figure 7C:
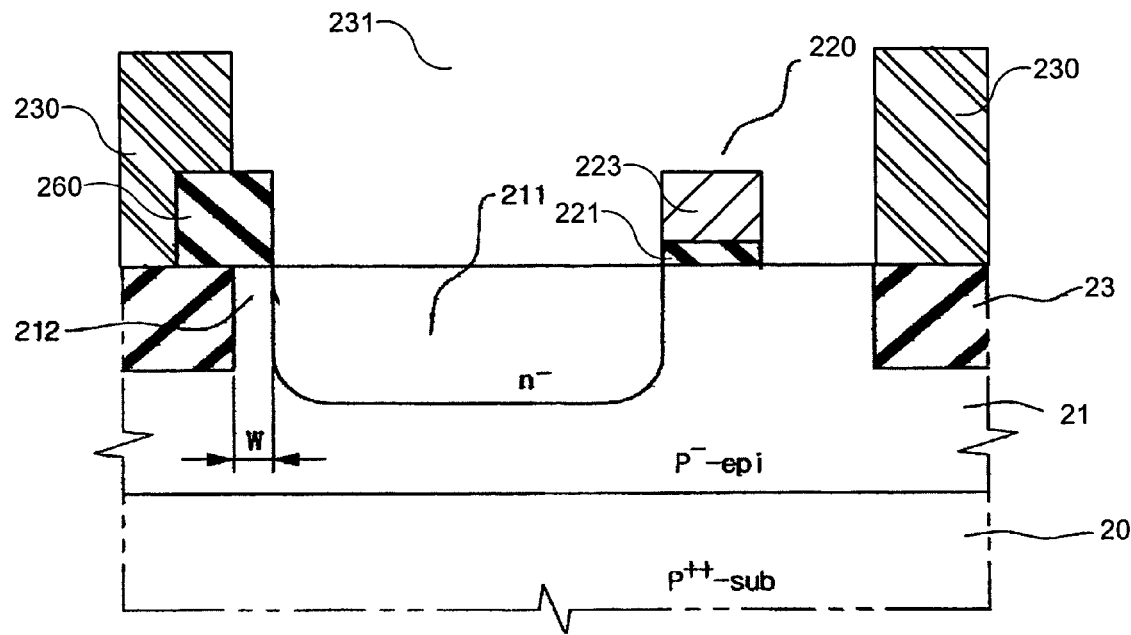
Figure 7D:
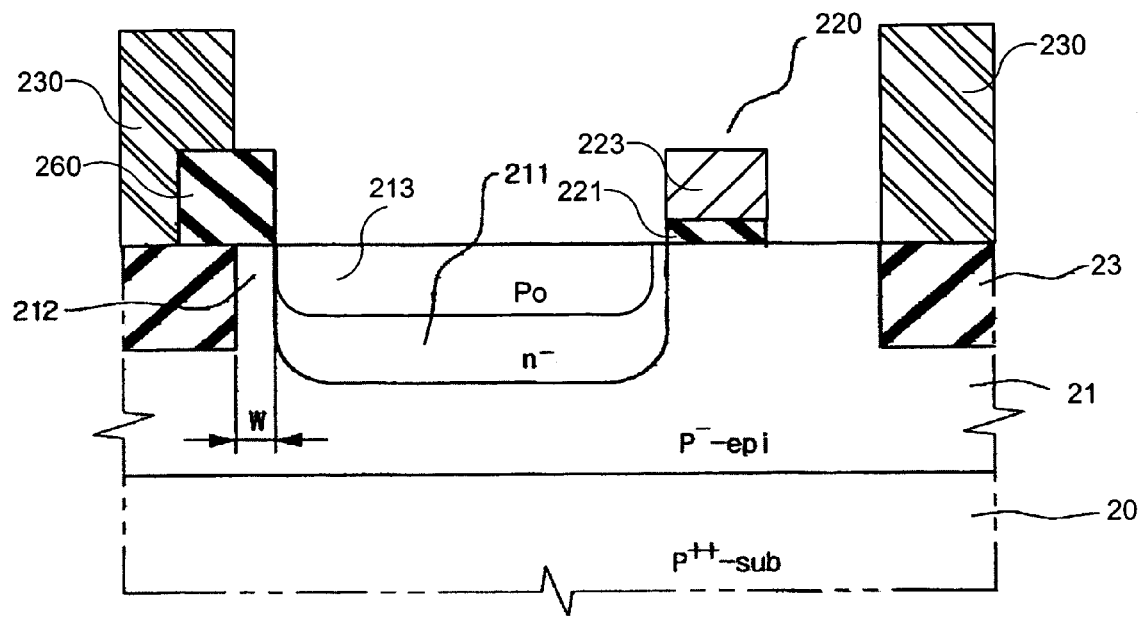

Referring to FIG. 7C, a photoresist pattern 230 having an opening 231 is formed on the semiconductor substrate 20, exposing the active region of the photo diode PD. In one aspect, the passivation layer 260 masks the boundary portion 212 of the active region, and therefore, the active region for the n⁻ type diffusion region 211 is substantially exposed through the passivation layer 260 and the photoresist pattern 230.

Then, using the photoresist patterns 230 and the passivation layer 260 as a masking layer, n type impurities are ion-implanted with low concentration and high energy into the exposed epitaxial layer 21 to form the n⁻ type diffusion region 211. Since the passivation layer 260 covers a portion of the active region, the n⁻ type diffusion region 211 and isolation region 23 are spaced apart from each other by a distance W with the boundary portion 212 disposed therebetween. In one aspect, the passivation layer 260 has a thickness sufficient to mask the ion-implantation.

Referring to FIG. 7D, again using the photoresist pattern 230 and the passivation layer 260 as a mask, p type impurities are ion-implanted with a medium concentration and low energy into the n⁻ type diffusion region 211, forming the P° type diffusion region 213 of the photo diode in the n⁻ type diffusion region 211. Similarly, P° type diffusion region 213 and the isolation region 23 are disposed spaced apart from each other by a distance W with the boundary portion 212 disposed therebetween.

Accordingly, embodiments of the present invention prevent the boundary portion 212 between the isolation region 23 and the n⁻ type diffusion region 211 and the P° type diffusion region 213 from being damaged by the ion implantation of the n-type and p-type impurities and therefore prevents formation of defects due to the damages. As a result, the dark current of the CMOS image sensor according to the present invention is reduced.

In one aspect, the photodiode according to the present invention may have only the n⁻ type diffusion region 211, by omitting the ion implantation for forming the P° type diffusion region 213.

Figure 7E:
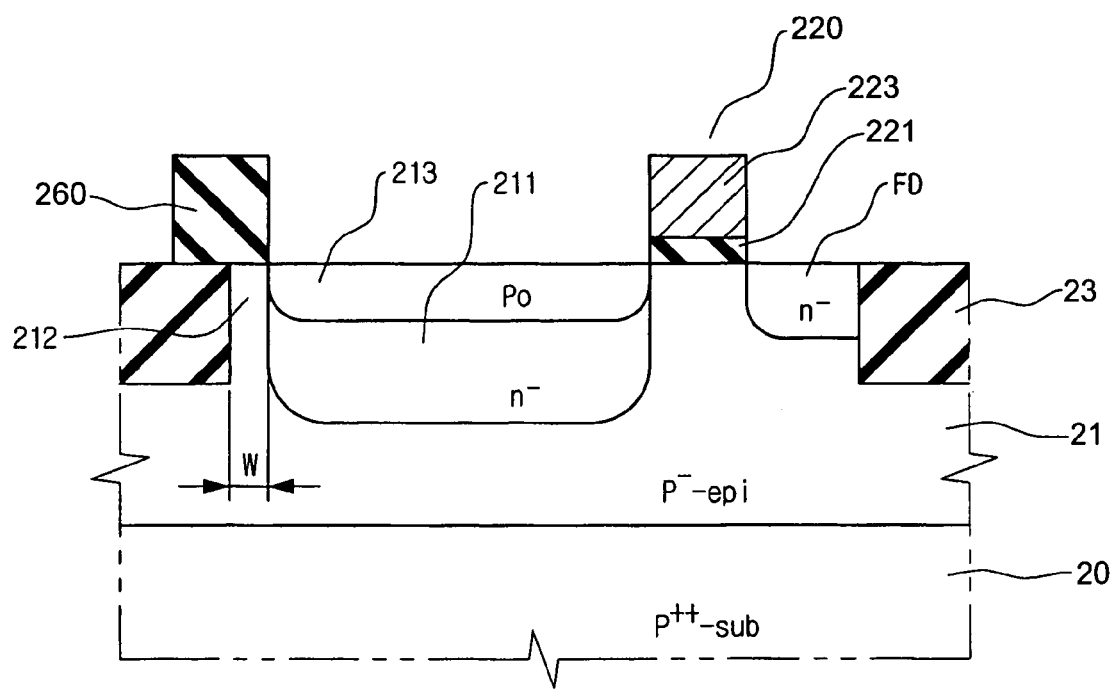

Referring to FIG. 7E, after removing the photoresist pattern 230 and upon annealing, a junction is formed between the n⁻ type diffusion region 211 and the P° type diffusion region 213 through diffusion of the impurities implanted into the n⁻ type diffusion region 211 and the P° type diffusion region 213.

Since the n⁻ type diffusion region 211 and the P° type diffusion region 213 are spaced apart from the isolation region 23 by a distance W, an increase of leakage current generated in the boundary portion of the isolation region 23 is prevented, and the dark current is reduced.

Then, using conventional manufacturing processes, the floating diffusion region FD and the source/drain diffusion regions (not shown) of the transfer transistor 220, the reset transistor 230, the drive transistor 240, and the select transistor 250 are formed, and thus, the unit pixel of the CMOS image sensor of the present invention is completed. The manufacturing processes for forming the floating diffusion region FD and the source/drain diffusion regions are well known in the art and thus are not described in detail.

As described above, in the CMOS image sensor and the manufacturing method thereof of the present invention, the gates of the transistors of the CMOS image sensor are formed in the active region of the unit pixel, and the passivation layer composed of insulating material is formed on the semiconductor substrate and covers a portion of the active region adjacent to the isolation region, so that the active region of the photo diode is spaced apart from the isolation region. Thus, impurities for forming the diffusion regions of the photo diode are ion-implanted to the active region for the photo diode, wherein the passivation layer prevents the boundary portion of the active region from being ion-implanted.

Accordingly, embodiments of the present invention have advantages in that damages by an ion implantation of impurities at the boundary portion between the diffusion region for the photo diode and the isolation region are prevented, and in that dark current of the CMOS image sensor is reduced.

It is to be understood that the above embodiments of the present invention have been described only for illustrative purposes. Those skilled in the art will appreciate that various modifications, additions and substitutions are possible, without departing from the scope and spirit of the invention as disclosed in the accompanying claims.

What is claimed is:

1. A method for manufacturing a CMOS image sensor, comprising:
    forming an isolation region in a semiconductor substrate to define an active region for a unit pixel of the CMOS image sensor;
    forming a gate electrode on said semiconductor substrate;
    forming a passivation layer on the isolation region and a boundary region between said isolation region and said active region;
    forming a masking layer to expose a portion of the active region over the semiconductor substrate; and
    performing an ion implantation of impurities using said passivation layer and said masking layer as an ion implantation mask for forming a diffusion region of a photo diode in a portion of the active region, wherein said diffusion region is formed spaced apart from said isolation region.

2. The method for manufacturing a CMOS image sensor as claimed in claim 1, wherein said boundary region is formed to have a width of about 50 micrometers.

3. A method for manufacturing a CMOS image sensor, comprising:

forming an isolation region in a semiconductor substrate to define an active region for a unit pixel of the CMOS image sensor;

forming a passivation layer over a boundary between the isolation region and the active region;

forming a mask layer on the isolation region and a portion of the passivation layer; and performing an ion implantation of impurities for forming a diffusion region for a photo diode in a portion of the active region, wherein said diffusion region is formed spaced apart from said isolation region.

4. The method for manufacturing a CMOS image sensor as claimed in claim 3, wherein said passivation layer is composed of an insulating layer.

5. The method for manufacturing a CMOS image sensor as claimed in claim 3, wherein said passivation layer is composed of any one of a single layer of an oxide layer and a single layer of a nitride layer.

6. The method for manufacturing a CMOS image sensor as claimed in claim 3, wherein said passivation layer is composed of multi layers of at least one oxide layer and at least one nitride layer.

7. The method for manufacturing a CMOS image sensor as claimed in claim 3, wherein said mask layer is a photo-resist layer.

8. The method for manufacturing a CMOS image sensor as claimed in claim 3, wherein said semiconductor substrate is a $p^{++}$ type silicon substrate having a $P^{31}$ type epitaxial layer formed thereon, and the diffusion region for said photo diode has an $n^-$ type diffusion region.

9. The method for manufacturing a CMOS image sensor as claimed in claim 8, wherein a $P^o$ type diffusion region is formed in said $n^-$ type diffusion region of the photo diode so as to reduce dark current generated on the surface of said semiconductor substrate.

* * * * *